(12) United States Patent
Kamijima

(10) Patent No.: US 6,825,122 B2
(45) Date of Patent: Nov. 30, 2004

(54) METHOD FOR FABRICATING A PATTERNED THIN FILM AND A MICRO DEVICE

(75) Inventor: Akifumi Kamijima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/731,030

(22) Filed: Dec. 10, 2003

(65) Prior Publication Data

US 2004/0127057 A1 Jul. 1, 2004

(30) Foreign Application Priority Data

Dec. 25, 2002 (JP) ........................................ 2002-374865

(51) Int. Cl.[7] ..................... H01L 21/311; H01L 29/739; G03C 5/00
(52) U.S. Cl. ..................... 438/694; 438/758; 438/759; 438/555; 438/689; 438/725; 257/194; 257/678; 257/686; 430/312; 430/313; 430/315
(58) Field of Search ................................. 438/694, 758, 438/759, 555, 689, 725, 315, 319; 257/194, 471, 678, 751, 686; 430/312–315

(56) References Cited

U.S. PATENT DOCUMENTS

| | | | | |
|---|---|---|---|---|
| 5,604,073 A | * | 2/1997 | Krounbi et al. | ................ 430/14 |
| 5,658,469 A | * | 8/1997 | Jennison | ...................... 428/611 |
| 5,721,078 A | | 2/1998 | Kamijima | |
| 5,725,997 A | | 3/1998 | Kamijima | |
| 5,747,198 A | | 5/1998 | Kamijima | |
| 6,052,261 A | * | 4/2000 | Watanabe et al. | ......... 204/192.1 |
| 6,566,276 B2 | * | 5/2003 | Maloney et al. | ............ 438/758 |
| 6,605,519 B2 | * | 8/2003 | Lishan | ........................ 438/555 |

FOREIGN PATENT DOCUMENTS

JP         A 9-96909         4/1997

* cited by examiner

Primary Examiner—Matthew Smith
Assistant Examiner—Igwe U. Anya
(74) Attorney, Agent, or Firm—Oliff & Berridge, PLC

(57) ABSTRACT

An organic resin with an optical crosslinking agent therein is coated to form an organic resin layer over a resist mast and a patterned thin film, and crosslinked. Although some debris are formed over the resist mask in the fabrication of the patterned thin film, they are trapped by the crosslinked organic resin layer. The resist mask and the organic resin layer are removed through immersion in an organic solvent and vibration therein without flashes.

11 Claims, 16 Drawing Sheets

METHOD FOR FABRICATING A PATTERNED THIN FILM AND A MICRO DEVICE

BACKGROUND OF THE INVENTION

1. Field of the Invention

This invention relates to a method for fabricating a patterned thin film and a micro device with the patterned thin film.

2. Related Art Statement

In the fabrication of a micro device with a patterned thin film, the patterned thin film is formed by utilizing a patterned resist mask. Herein, the "micro device" means a small-sized device formed by means of film-forming technique, and encompasses a semiconductor device, a thin film magnetic head, a sensor with a thin film, a actuator with a thin film and the like.

The patterned thin film is also formed by means of dry-etching (which is described as a milling patterning method in Patent Document 1), lift-off, the combination thereof or the like.

In the micro device such as the semiconductor device, the thin film magnetic head, the sensor and actuator with their respective thin films, on the other hand, it is strongly required to miniaturize the patterned thin film, along with to down-size the micro device and to develop the performances of the micro device. In order to satisfy the above-mentioned requirements, it is required to reduce the width and the thickness of a resist mask to be utilized in the fabrication of the patterned thin film.

In the fabrication of the patterned thin film by means of lift-off, in contrast, it becomes difficult to infiltrate a solvent around the resist mask to be removed as the thickness of the resist mask is decreased. As a result, the resist mask may be not removed perfectly, and thus, some flashed may remained.

In the fabrication of the patterned thin film by means of dry etching, some dry etched debris, which are exfoliated from the resist mask, may be attached to the boundaries between the resist mask and the patterned thin film under dry etching process, so that some flashes may remained after the removing process with a solvent. In the fabrication of the patterned thin film by means of the combination of the lift off and the dry etching, the similar flashes may be created after the removing process of resist mask.

In this way, if flashes remain after the removing process of resist mask, the quality and reliability of the intended micro device may be degraded and the production yield of micro device may be deteriorated.

[Patent document 1]
Japanese Patent Application Laid-open No. 9-96909

SUMMARY OF THE INVENTION

It is an object of the present invention to provide a method for fabricating a patterned thin film, whereby the resist mask can be removed without flashes, and a micro device with the patterned thin film.

For achieving the above objects, this invention relates to a method for fabricating a patterned thin film, comprising the steps of:
preparing a base,
forming a resist mask on the base,
forming a thin film via the resist mask to form a patterned thin film,
coating an organic resin with an optical crosslinking agent therein to form an organic resin layer over the resist mask and the patterned thin film,
crosslinking the organic resin layer, and
removing the resist mask and the organic resin layer.

In the crosslinking the organic resin layer with the optical cross-linking agent therein, exposure is carried out over the organic resin layer if the crosslinking agent is negative.

In the present invention, since the patterned thin film is formed on the base with the resist mask by means of dry etching, the dry etched debris may be attached over the resist mask and the boundaries between the resist mask and the patterned thin film under dry etching. As a result, some flashes remain after the removing process of resist mask with a solvent, as mentioned above. If the combination of lift-off and dry etching is employed to remove the resist mask, some flashes remain, as mentioned above.

In order to remove the flashes originated from the attachment of the dry etched debris, in the present invention, the organic resin layer with the crosslinking agent is formed over the resist mask and the patterned thin film, and then, crosslinked. With the dry etching, the resultant dry etched debris are trapped around the resist mask by the crosslinked organic resin layer. With the lift off, the resultant lifted-off debris are trapped around the resist mask by the crosslinked organic resin layer.

After the trapping of the debris with the crosslinked organic resin layer, the organic resin layer and the resist mask are removed. In the removal, the assembly under fabrication is immersed into an organic solvent and vibrated therein or irradiated by an ultrasonic wave.

According to the above-mentioned process, the resist mask can be removed without flashes.

The resist mask may be made of a single-layered resist mask or a multilayered resist mask. With the single-layered resist mask, no undercut portion is formed. With the multilayered resist mask, a top resist layer and a bottom resist layer are successively formed. Some undercut portions are formed at the bottom resist layer. The surface area of the top resist layer is set larger the surface area of the bottom resist layer. With the multilayered resist mask, the patterned thin film can be miniaturized easily due to the undercut portions of the bottom resist layer thereof.

In the present invention, the patterned thin film can be made by means of lift off, dry etching, the combination thereof or the like.

The fabricating method of patterned thin film of the present invention can be applied to the fabrication of a micro device. In this case, a given patterned thin film of the micro device is formed by the fabricating method of patterned thin film. As the micro device are exemplified a thin film magnetic head, a semiconductor device, a sensor with a thin film, an actuator with a thin film and the like. With the thin film magnetic head, a magnetoresistive effective element is composed of the resultant patterned thin film.

BRIEF DESCRIPTION OF THE DRAWINGS

For a better understanding of this invention, reference is made to the attached drawings, wherein.

DETAILED DESCRIPTION OF PREFERRED EMBODIMENTS

1. Lift off Technique

FIGS. 1–8 are explanatory views for a method for fabricating a patterned thin film utilizing lift off technique.

Figure 1:
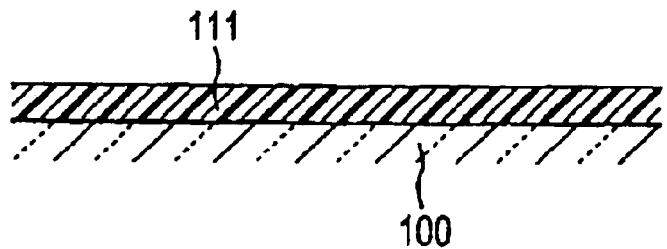
FIG. 1 is a cross sectional view showing one step in a method for fabricating a patterned thin film according to the present invention utilizing lift off technique.

First of all, as shown in FIG. 1, a bottom resist layer 111 is formed on a base 100 such as a substrate by means of spin coating, and then, heated as occasion demands.

The bottom resist layer 111 is made of a resist material which is not intermixed with a top resist layer to be formed and enables some undercuts to be formed easily. The undercuts may be formed by means of development, ashing or the combination thereof.

With the development, a soluble in an alkaline solution and larger in solution rate for the alkaline solution resist material than the one of the top resist layer to be formed may be employed. Concretely, polymethylglutarimide (PMGI) may be exemplified as follows:

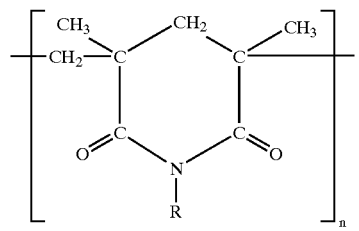

Herein, "R" represents H (hydrogen) or $CH_3$ (methyl group), and "n" represents an integral number not less than "0".

With the ashing, a lager in ashing rate resist material than the one of the top resist layer to be formed may be employed. With the combination of the development and the ashing, a soluble in an alkaline solution and larger in ashing rate resist material than the one of the top resist layer to be formed may be employed.

In this embodiment, the undercuts will be made in the bottom resist layer by means of development, hereinafter.

Figure 2:
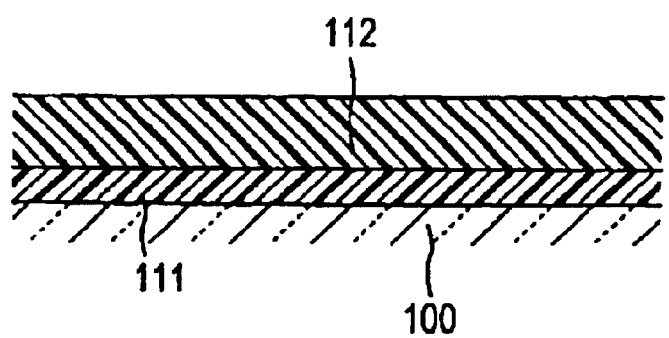
FIG. 2 is a cross sectional view showing a step after the step shown in FIG. 1.

After the step shown in FIG. 1, as shown in FIG. 2, a top resist layer 112 is formed on the bottom resist layer 111 by means of spin coating or the like. The top resist layer 112 is preferably made mainly of a phenol-based hydroxyl group-containing resist. As the resist of the top resist layer 112 may be exemplified the following resist:

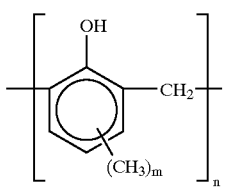

Herein, "m" represents an integral number within 1–3, and "n" represents an integral number not less than "0".

As the resist of the top resist layer may be also exemplified the following resist:

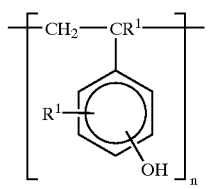

Herein, "$R^1$" represents H (hydrogen) or $CH_3$ (methyl group), and "n" represents an integral number not less than "0".

In addition, as the resist of the top resist layer 112 may be exemplified an NQD-novolak resist (naphthoquinonediazide-novolak resist: Japanese examined patent application No. 37-18015), an integral type NGD-novolak resist (Japanese unexamined patent application No. 6-242602), an integral type hydrophobic NQD-novolak resist (Japanese unexamined patent application No. 2000-63466 and a chemically amplified resist with polyhydroxy-styrene (Japanese unexamined patent application No. 6-273934).

Figure 3:
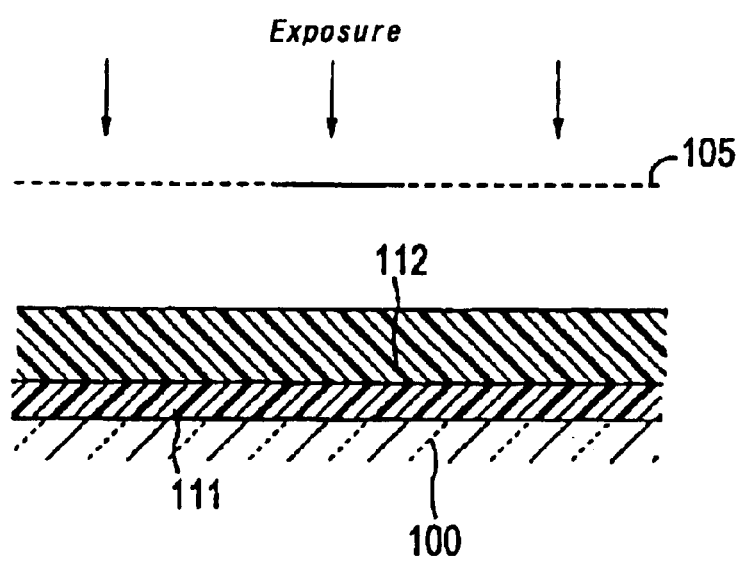
FIG. 3 is a cross sectional view showing a step after the step shown in FIG. 2.

Then, as shown in FIG. 3, the top resist layer 112 is exposed via a mask 105 to form a patterning latent image thereon. The exposure may be carried out with ultraviolet ray, excimer laser beam, electron beam and the like. With the use of electron beam, the exposure may be carried out without the mask 105 to form a patterning latent image directly. If necessary, the top resist layer 112 is heated (pre-baked) after the exposure.

Figure 4:
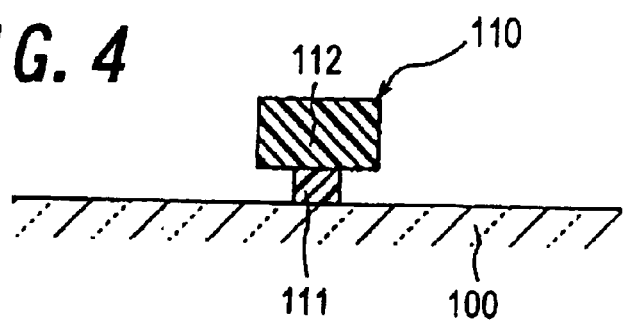
FIG. 4 is a cross sectional view showing a step after the step shown in FIG. 3.

Then, as shown in FIG. 4, the top resist layer 112 is developed, and the bottom layer 111 is partially dissolved. After the development, the bottom resist layer 111 and the top resist layer 112 are washed with water and dried. Thereby, some undercuts are made at the bottom resist layer 111 to form a resist mask 110. In the resist mask 110, the surface area of the top resist layer 112 is larger than the surface area of the bottom resist layer 111 due to the undercuts. Since the resist mask 110 has the undercuts, it can be employed in the miniaturization of a patterned thin film to be formed. The development is preferably carried out with an alkaline water solution such as tetramethylammonium-hydroxide (TMAH).

Figure 5:
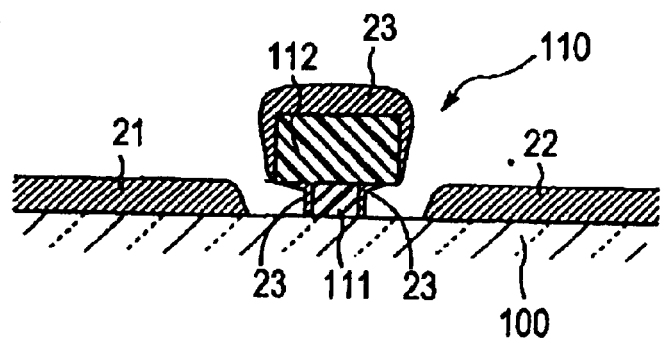
FIG. 5 is a cross sectional view showing a step after the step shown in FIG. 4.

Then, as shown in FIG. 5, patterned thin films 21 and 22 are formed by means of film-forming process such as sputtering or CVD while the resist mask 110 remains on the base 100. In this case, some debris 23 are attached over the resist mask 110. The edges of the debris 23 are contacted with the base 100.

Conventionally, the resist mask 110 is removed by means of lift off after the step shown in FIG. 5. In this case, the debris at the boundaries between the resist mask 110 and the base 100 are peeled off by force to form some flashes, causing the degradation in the quality and reliability of the intended micro device and in the production yield of micro device.

Figure 6:
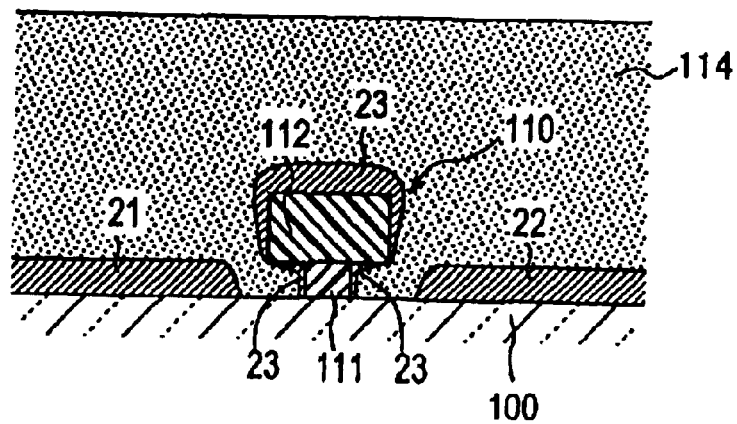
FIG. 6 is a cross sectional view showing a step after the step shown in FIG. 5.
Figure 7:
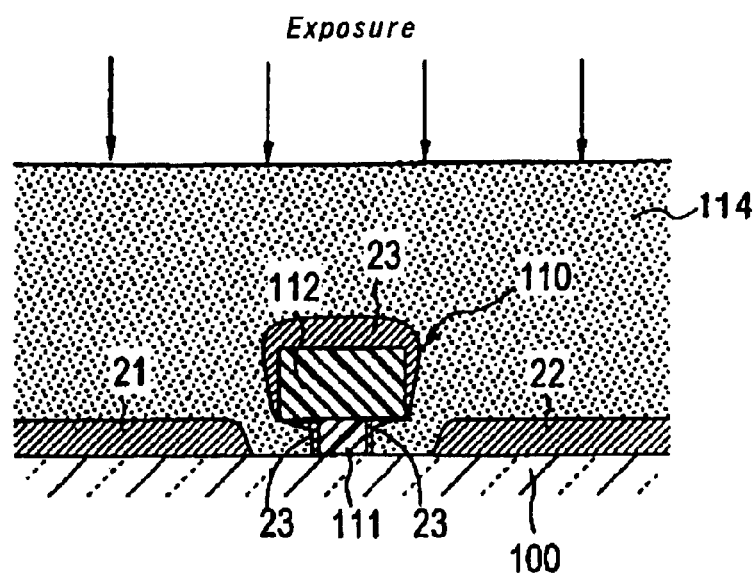
FIG. 7 is a cross sectional view showing a step after the step shown in FIG. 6.

In the present invention, in this point of view, as shown in FIG. 6, an organic resin with an optical crosslinking agent therein is coated over the assembly under fabrication to form an organic resin layer 114. Then, as shown in FIG. 7, the organic resin layer 114 is crosslinked by the irradiation of light.

The organic resin layer 114 contains a resin as a main component and other substance such as solvent only if the layer 114 is hardened through crosslinking by the irradiation of light and peeled off by means of lift off. The organic resin layer 114 may contain one or more resins and one or more solvents.

Concretely, the organic resin layer 114 may contain cyclized polyisoprene, cyclized polybutadiene, polyhydroxystyrene, polyacrylamide, polyamino acid or polymethyl methacrylate as the main resin. Also, the organic resin layer 114 may contain azide compound or bisazide compound as the optical crosslinking agent.

The organic resin layer 114 may contain ketone such as cyclohexane, alcohol such as 1-ethoxy-2-propanol, ether such as propyleneglycolmonomethyl ether, ester such as propylenegrycolmonomethylether acetate, ethyl lactate, butyl acetate, and xylene.

CIR701 made by JSR Co. Ltd. is commercially available for the organic resin layer 114. The CIR701 is a rubber-based negative resist, and contains cyclized polyisoprene, 4-nitrodiphenylamine and xylene.

In the use of the CIR701, since the organic resin layer 114 is negative, exposure is carried out over the assembly under fabrication to crosslink the organic resin layer 114. In this case, the debris 23 over the resist mask 110 are trapped with the crosslinked organic resin layer 114.

After the trapping of the debris 23 with the crosslinked organic resin layer 114, the assembly is immersed into an organic solvent and vibrated to dissolve the organic resin layer 114 with the resist mask 110. Instead of the immersion and the vibration, ultrasonic wave may be irradiated onto the assembly.

Figure 8:
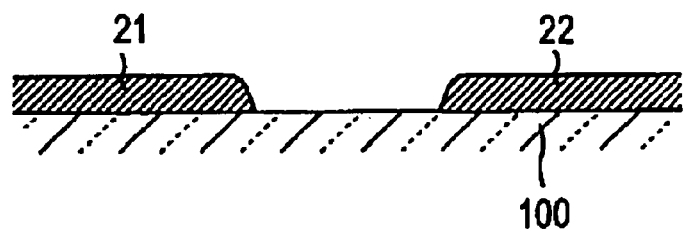
FIG. 8 is a cross sectional view showing a step after the step shown in FIG. 7.

According to the above-mentioned process, the organic resin layer 114 and the resist mask 110 can be removed without flashes, as shown in FIG. 8. As a result, no flash is created at the patterned thin films 21 and 22.

2. Dry Etching Technique

FIGS. 9–17 are explanatory views for a method for fabricating a patterned thin film utilizing dry etching technique.

Figure 9:
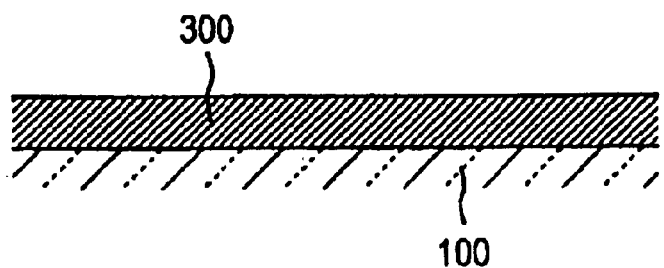
FIG. 9 is a cross sectional view showing one step in a method for fabricating a patterned thin film according to the present invention utilizing dry etching technique.

First of all, as shown in FIG. 9, a film 300 to be patterned is formed on a base 100 such as a substrate by means of film-forming technique such as sputtering, CVD method or plating method. The film 300 is made of a metallic film, an inorganic film or the like. Moreover, the film 300 is made of a single-layered film or a multilayered film.

Figure 10:
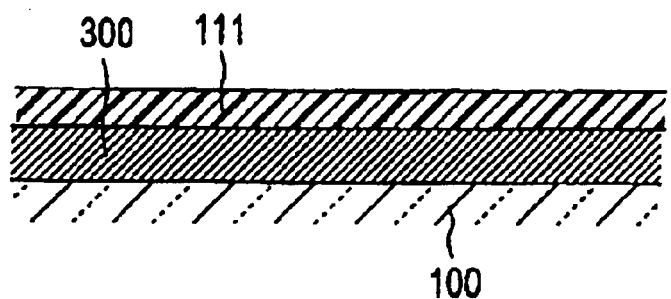
FIG. 10 is a cross sectional view showing a step after the step shown in FIG. 9.
Figure 11:
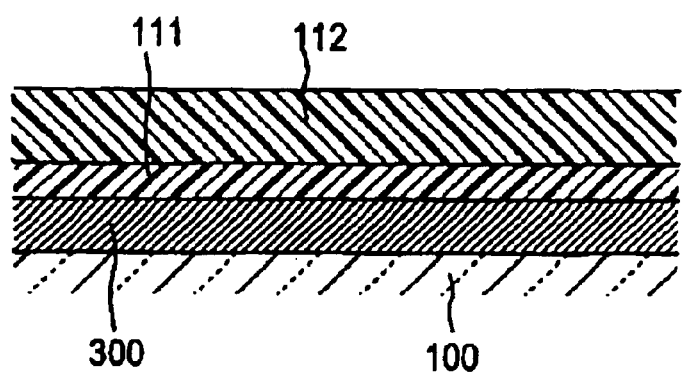
FIG. 11 is a cross sectional view showing a step after the step shown in FIG. 10.
Figure 12:
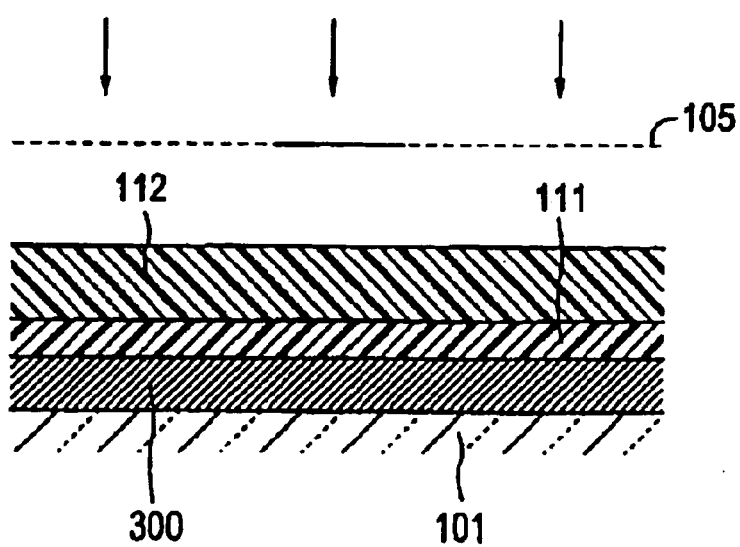
FIG. 12 is a cross sectional view showing a step after the step shown in FIG. 11.
Figure 13:
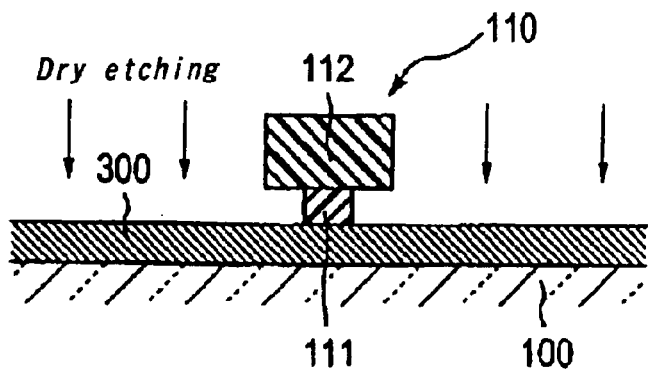
FIG. 13 is a cross sectional view showing a step after the step shown in FIG. 12.

Then, as shown in FIG. 10, a bottom resist layer 111 is formed on the film 300, and processed as shown in FIGS. 11–13. In the steps shown in FIGS. 11–13, the intended resist mask 110 is formed in the same manner as the above-mentioned embodiment relating to FIGS. 2–4, so that explanation for the fabrication of the resist mask 110 will be omitted.

Figure 14:
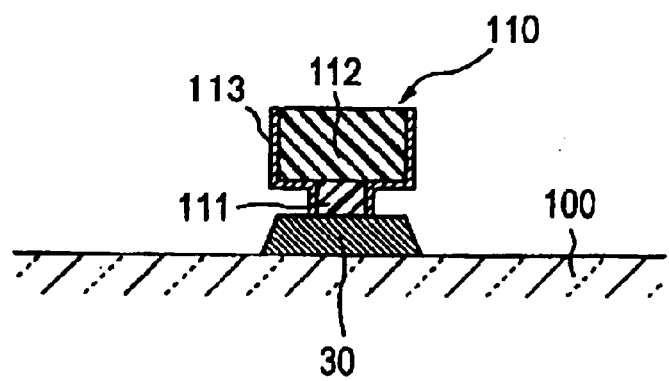
FIG. 14 is a cross sectional view showing a step after the step shown in FIG. 13.

After the fabrication of the resist mask 110, as shown in FIG. 13, the film 300 is etched with the resist mask 110 by means of dry etching such as ion milling or reactive ion etching (RIE) to be patterned in a predetermined shape, as shown in FIG. 14. Prior to the patterning process, the assembly may be ashed entirely.

In this case, as shown in FIG. 14, the dry etched debris 113 is attached over the resist mask 110. The edges of the debris 113 are contacted with the patterned thin film 30 formed at the bottom of the resist mask 110.

Conventionally, the resist mask 110 is removed with an organic solvent. In this case, the debris at the boundaries between the resist mask 110 and the film 113 are peeled off by force to form some flashes, causing the degradation in the quality and reliability of the intended micro device and in the production yield of micro device.

Figure 15:
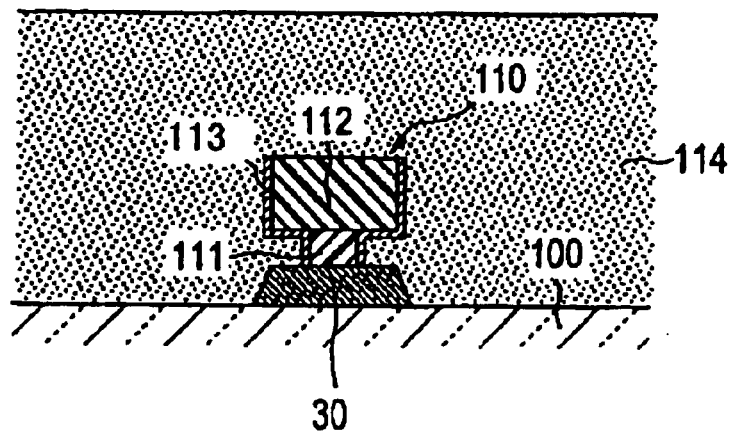
FIG. 15 is a cross sectional view showing a step after the step shown in FIG. 14.
Figure 16:
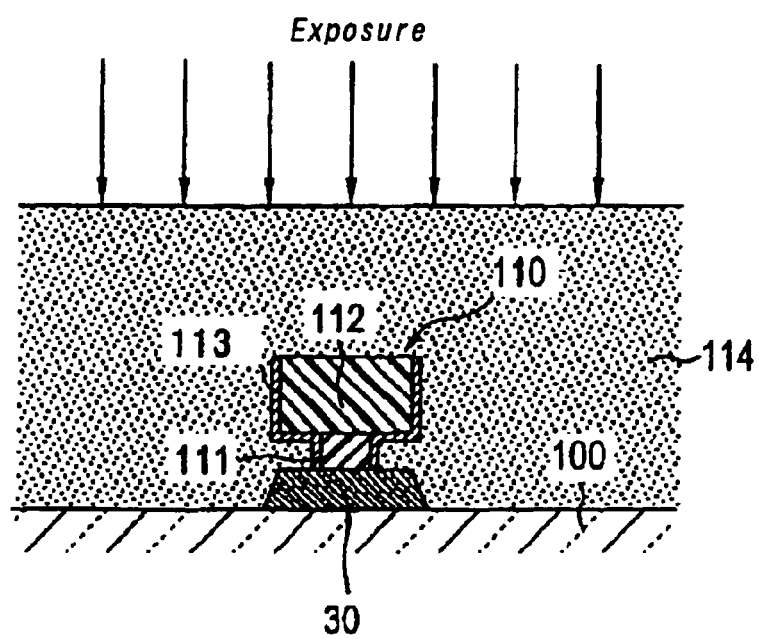
FIG. 16 is a cross sectional view showing a step after the step shown in FIG. 15.

In the present invention, in this point of view, as shown in FIG. 15, an organic resin with an optical crosslinking agent therein is coated over the assembly under fabrication to form an organic resin layer 114. Then, as shown in FIG. 16, the organic resin layer 114 is crosslinked by the irradiation of light. In this case, the debris 23 over the resist mask 110 are trapped with the crosslinked organic resin layer 114.

After the trapping of the debris 23 with the crosslinked organic resin layer 114, the assembly is immersed into an organic solvent and vibrated to dissolve the organic resin layer 114 with the resist mask 110. Instead of the immersion and the vibration, ultrasonic wave may be irradiated onto the assembly, as mentioned above.

Figure 17:
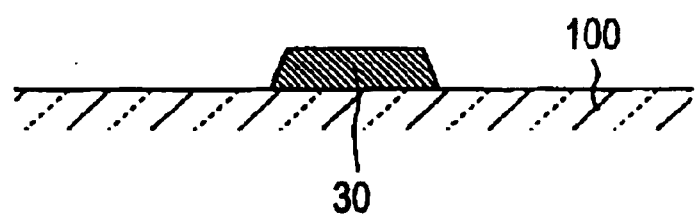
FIG. 17 is a cross sectional view showing a step after the step shown in FIG. 16.

According to the above-mentioned process, the organic resin layer 114 and the resist mask 110 can be removed without flashes, and as shown in FIG. 17, no flash is created at the patterned thin film 30.

3. Combination of Lift off and Dry Etching

FIGS. 18–26 are explanatory views for a method for fabricating a patterned thin film utilizing the combination of lift off technique and dry etching technique.

First of all, as shown in FIGS. 18–22, the intended resist mask 110 is formed. In the steps shown in FIGS. 18–22, the resist mask 110 is formed in the same manner as the above-mentioned embodiment relating to FIGS. 9–13, so that explanation for the fabrication of the resist mask 110 will be omitted.

Figure 23:
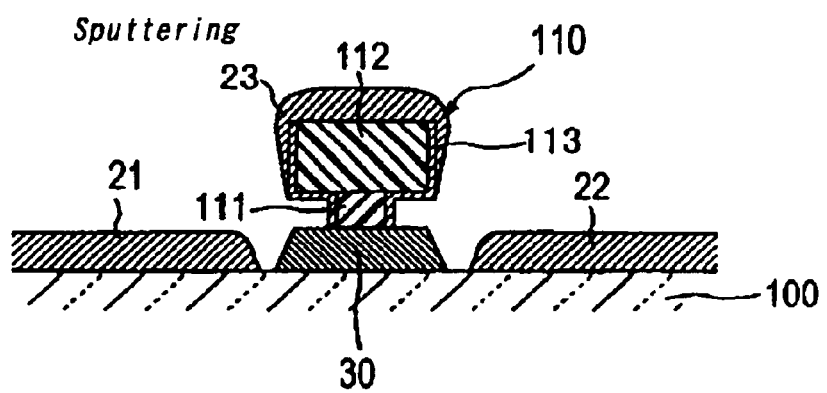
FIG. 23 is a cross sectional view showing a step after the step shown in FIG. 22.
Figure 24:
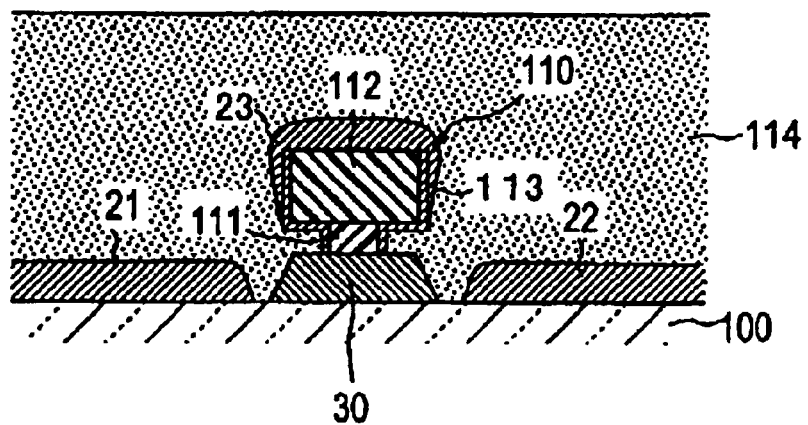
FIG. 24 is a cross sectional view showing a step after the step shown in FIG. 23.
Figure 25:
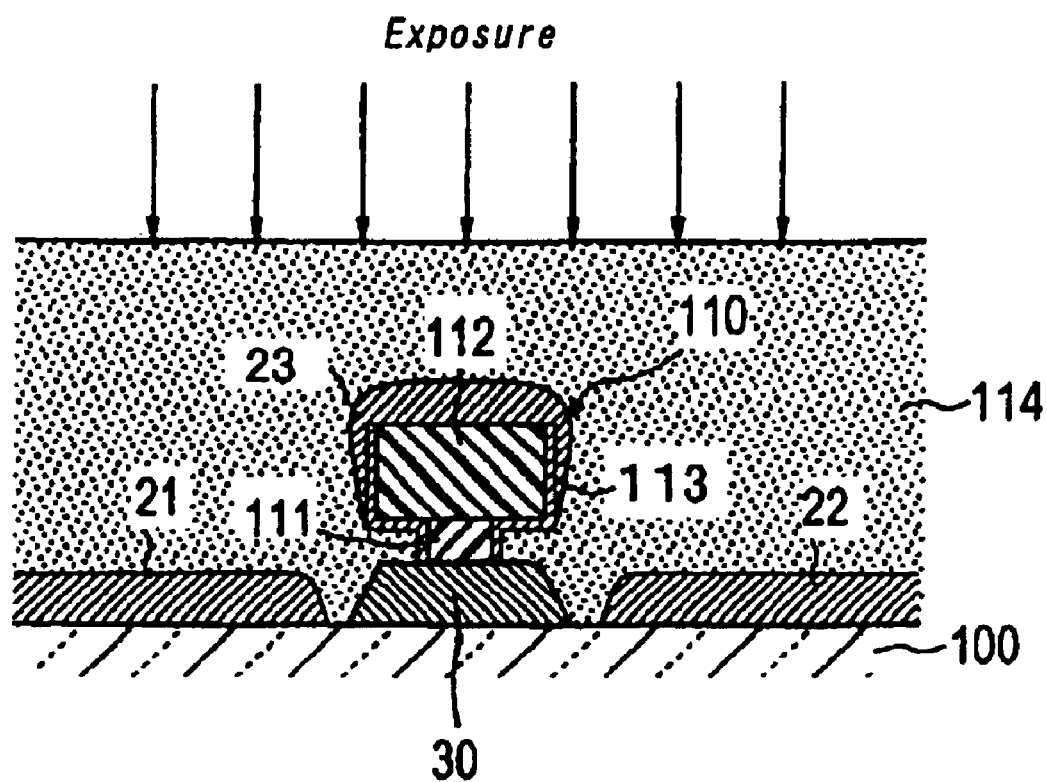
FIG. 25 is a cross sectional view showing a step after the step shown in FIG. 24.
Figure 26:
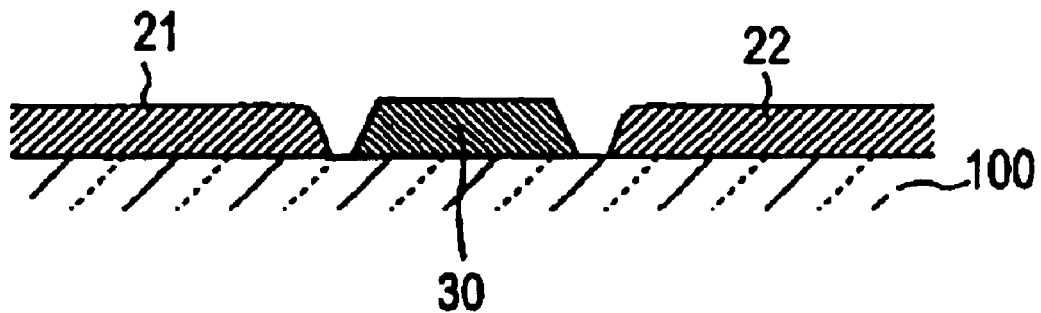
FIG. 26 is a cross sectional view showing a step after the step shown in FIG. 25.

After the fabrication of the resist mask 110, as shown in FIG. 23, patterned thin films 21 and 22 are formed by means of film-forming process such as sputtering or CVD while the resist mask 110 remains on the patterned thin film 30. Then, as shown in FIGS. 24–26, the organic resin layer 114 and the resist mask 110 are peeled off from on the patterned thin film 30, to form the patterned thin films 30, 21 and 22 without flashes, as shown in FIG. 26. In the steps shown in FIGS. 23–26, the lift off process is performed in the same manner as the above-mentioned embodiment relating to FIGS. 1–5, so that explanation of the lift off process will be omitted in this section, but will be described in Example as follows.

EXAMPLE

Figure 18:
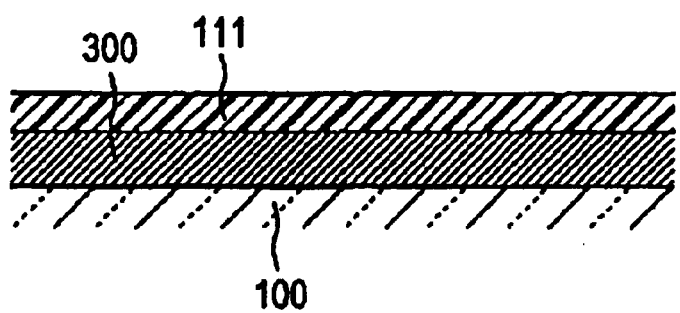
FIG. 18 is a cross sectional view showing one step in a method for fabricating a patterned thin film according to the present invention utilizing the combination of lift off technique and dry etching technique.

In the step shown in FIG. 18, the base 100 was made of an AlTiC substrate with a diameter of 3 inches and a thickness of 2 mm. Then, the film 300 was formed of NiFe (80–20 wt %) in a thickness of 30 nm on the base 100 by means of sputtering. The sputtering process was performed by utilizing SPF-740 made by ANELVA CORPORATION under the following condition:

Gas: Ar

Electric power: 1500 W, DC

Diameter of target: 8 inches

Flow rate of gas: 15 sccm

Pressure: 0.25 Pa

Deposition rate: about 15 nm/sec

Herein, the measurement unit "sccm" was abbreviated from standard cubic cm, and means a flow rate per minute under standard condition of 1 atom ($1.01325 \times 10^5$ Pa).

In the step shown in FIG. 18, the bottom resist layer 111 was made of PMGI (LOL-500 made by SHIPLEY FAR EAST LTD.) in a thickness of 50 nm, and heated at 180° C. for 300 seconds.

Then, the top resist layer 112 was formed of a resist (AZ5105P made by Clariant (Japan) K.K.) in a thickness of 0.5 $\mu$m on the bottom resist layer 111 by means of spin coating, and heated (Pre-baked) at 120° C. for 60 seconds.

Figure 20:
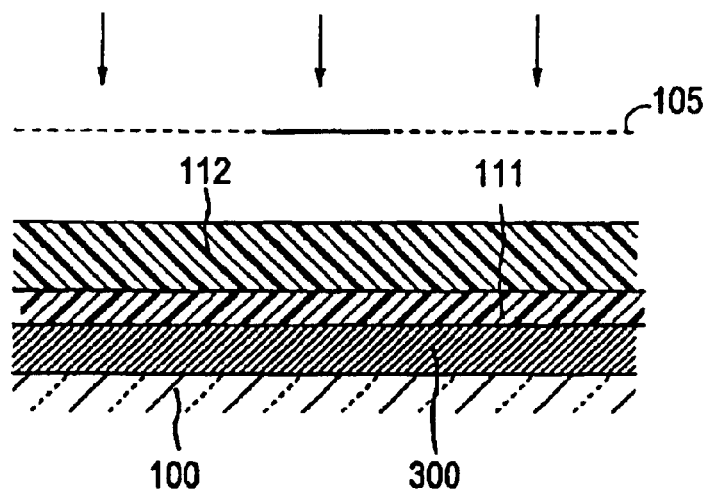
FIG. 20 is a cross sectional view showing a step after the step shown in FIG. 19.

Then, in the step shown in FIG. 20, the exposure process was performed by utilizing NSR-TFHEX14C made by Nikon Corporation under the following condition:

NA: 0.6

σ: 0.75

Dose: 22mJ/cm$^2$

Focus: 0 $\mu$m

Size of mask 105: 0.2 $\mu$m

In the step, the development process was performed by utilizing a 2.38%-tetramethylammoniumhydroxide (TMAH) for 30 seconds, one paddle.

Figure 19:
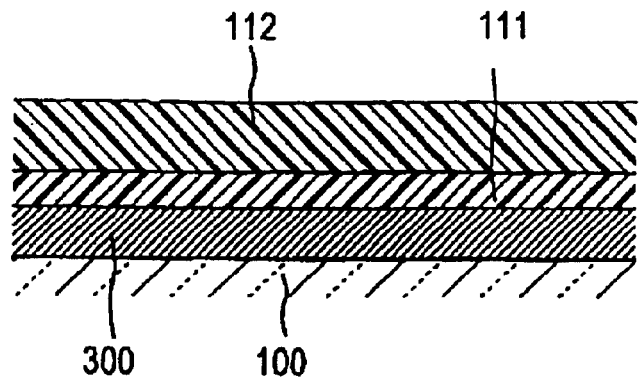
FIG. 19 is a cross sectional view showing a step after the step shown in FIG. 18.

Through the steps shown in FIGS. 18–20, the resist mask 110 with a width of 0.2 $\mu$m and a length of 3 $\mu$m was formed. In the resist mask 110, the undercuts with a depth of 3 $\mu$m were formed at the bottom resist layer 111. Therefore, the surface area of the top resist layer was set larger than the surface area of the bottom resist layer. In a practical operation, as the base was constructed as a wafer, a plurality of resist masks were arranged on the base 100.

Figure 21:
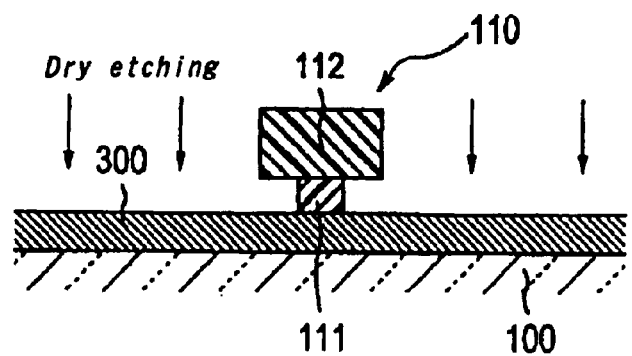
FIG. 21 is a cross sectional view showing a step after the step shown in FIG. 20.

After the formation of the resist mask 110, as shown in FIG. 21, the milling process was performed by utilizing IBE-IBD milling device made by Veeco Co. Ltd. under the following condition:

Gas: Ar

Flow rate of gas: 10 sccm

Pressure: $2 \times 10^{-4}$ Torr

Angle of milling: 5 degrees

Current of milling beam: 300 mA

Voltage of milling beam: DC 300 V

Voltage of acceleration: –500 V

Figure 22:
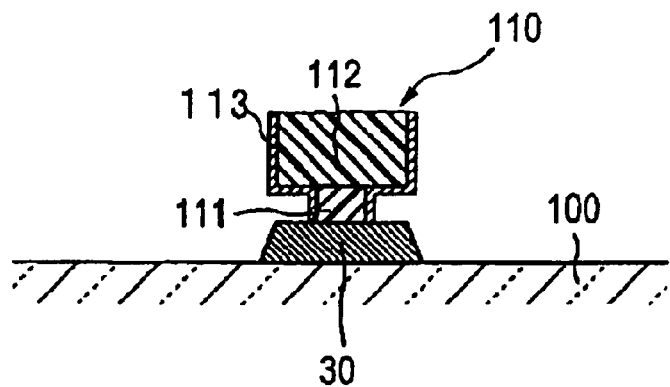
FIG. 22 is a cross sectional view showing a step after the step shown in FIG. 21.

As a result, the patterned thin film 30 was formed as shown in FIG. 22.

In the step shown in FIG. 23, the sputtering process was performed by utilizing IBE-IBD sputtering device made by Veccc Co. Ltd. under the following condition:

Gas: Ar

Flow rate of gas: 5 sccm

Pressure: $2 \times 10^{-4}$ Torr

Angle of milling: 30 degrees

Current of milling beam: 300 mA

Voltage of milling beam: DC 1500 V

Voltage of acceleration: –200 V

Target: Au

Thickness: 50 nm

Then, in the step shown in FIG. 24, the organic resin layer 114 was formed of CIR701 made by JSR Co. Ltd. in a thickness of 2 $\mu$m by means of spin coating. As mentioned above, the CIR701 is a rubber-based negative resist, and contains cyclized polyisoprene, 4-nitrodiphenylamine and xylene.

Then, in the step shown in FIG. 25, the exposure (optical crosslinking) was performed over the organic resin layer 114 by utilizing PLA-501(broad band)made by Canon, Inc. In this case, the Dose was set to 500 mJ/cm$^2$. Moreover, the organic resin layer was heated (pre-baked) at 110° C. for 180 seconds.

Then, in the step shown in FIG. 26, the peeling off was performed by immersing the assembly under fabrication into a N-methylpyrrolidone solution kept at 50° C. for one hour and vibrated. In this case, the crosslinked organic resin layer 114 and the resist mask 110 were dissolved and removed to form the patterned thin films 30, 21 and 22 without flashes.

When the patterned thin films 30, 21 and 22 were observed by CD-SEM S7800 made by Hitachi, Ltd., it was turned out that the patterned thin film 30 was made of NiFe in a width of 0.2 μm without flashes and isolated, and that the patterned thin films 21 and 22 were made of Au without flashes at both sides of the patterned thin film 30. Without the steps shown in FIGS. 25 and 26, conventionally, some flashes were created to decrease the production yield to 70%.

4. Application

In this embodiment, the above-mentioned fabricating method of patterned thin film will be applied to a thin film magnetic head with a giant magnetoresistive effective element (hereinafter, called as a "GMR" element) as a reading head. As the GMR element are exemplified a spin valve film (hereinafter, called as a "SV film") and a ferromagnetic tunnel junction element (hereinafter, called as a "TMR element").

Figure 27:
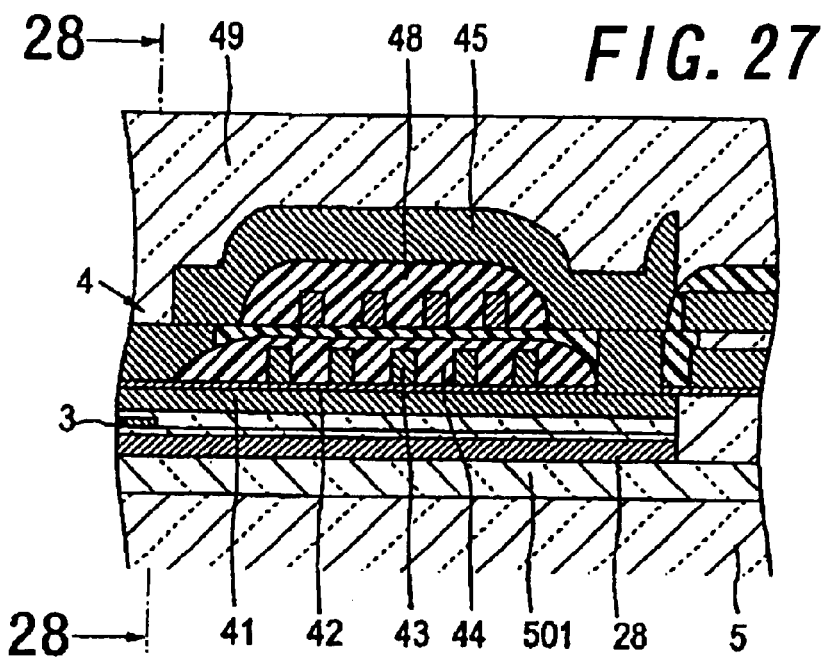
FIG. 27 is a cross sectional view showing a portion of a thin film magnetic head to which the fabricating method of the present invention is applied.
Figure 28:
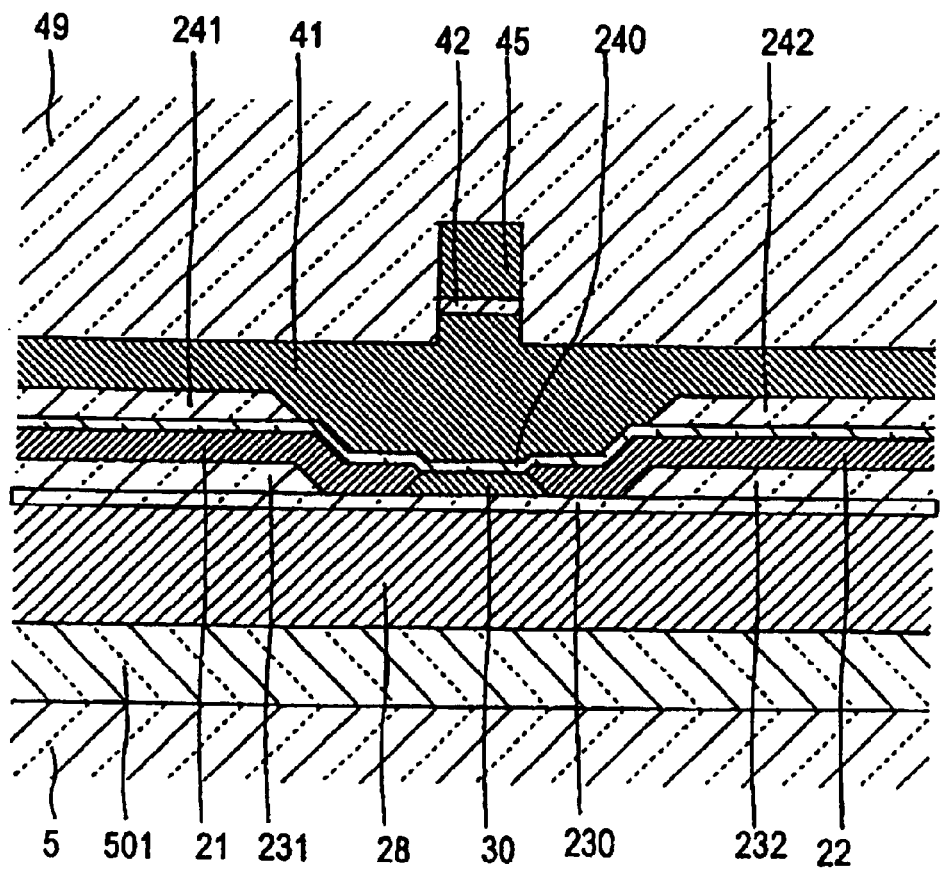
FIG. 28 is an enlarged cross sectional view showing the thin film magnetic head, taken on line 28—28.

FIG. 27 is an enlarged cross sectional view showing a portion of a thin film magnetic head, and FIG. 28 is also an enlarged cross sectional view of the thin film magnetic head shown in FIG. 28, taken on line "28—28". In a practical operation, a plurality of thin film magnetic heads are fabricated and mounted on a wafer made of AlTiC (Al$_2$O$_3$-TiC) or the like.

In the thin film magnetic head shown in FIGS. 27 and 28, a reading head 3 and a recording head 4 are incorporated, which are mounted on a substrate 5 to constitute a wafer The substrate 5 functions as a slider. On the substrate 5 are formed an insulating layer 501 made of alumina (Al$_2$O$_3$) or the like with a thickness within 1–5 μm and a bottom shielding layer 28 made of permalloy (NiFe) with a thickness of e.g., 3 μm by means of sputtering or plating.

In the reading head 3, the bottom shielding layer 28, a GMR element 30 and a top shielding layer (bottom magnetic pole layer) 41 are successively formed and stacked.

On the bottom shielding layer 28 is formed a bottom shielding gap layer 230 made of an insulating material such as alumina with a thickness (minimum thickness) within 10–200 nm. On the bottom shielding gap layer 230 are formed the GMR element 30 and electrode/magnetic domain controlling films 21, 22 with a thickness of several ten nm. Between the electrode/magnetic domain controlling films 21, 22 and the bottom shielding gap layer 230 are formed insulating layers 231 and 232 made of alumina or the like.

The GMR element 30 and the electrode/magnetic domain controlling films 21, 22 are covered with a top shielding gap layer 240 made of an insulating material such as alumina with a thickness (minimum thickness) within 10–200 nm by means of sputtering or the like.

In the recording head 4, the top shielding layer 41, a recording gap layer 42, a thin film coil 43 and a top magnetic layer 45 are successively formed and stacked. In this case, the top shielding layer 41 also functions as a bottom magnetic layer, which is magnetically connected with the top magnetic layer 45.

The top magnetic layer 41 is formed on the top shielding gap layer 240 at the center where the GMR element 30 is located, and on the insulating layers 241 and 242 at the both sides of the GMR element 30. The recording gap layer 42 is located between the magnetic pole portions made of the bottom magnetic layer 41 and the top magnetic layer 45. The thin film coil 43 is provided in the inner gap formed between the bottom magnetic layer 41 and the top magnetic layer 45. The inner gap and thus, the thin film coil 43 is embedded by an insulating film 48. Therefore, the thin film coil 43 is electrically insulated. The recording head 4 is covered with a protective film 49 made of alumina or the like.

The GMR element 30 is formed by utilizing the fabricating method of patterned thin film of the present invention, as mentioned above. The forming process will be described hereinafter, with reference to FIGS. 29–39. In this embodiment, the GMR element 30 is made of a SV film.

Figure 29:
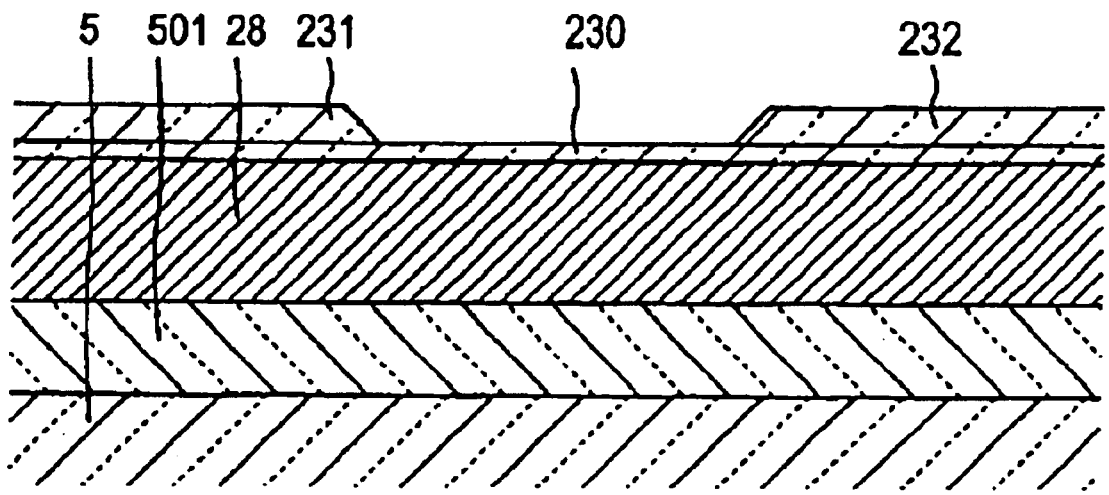
FIG. 29 is a cross sectional view showing the GMR element of the thin film magnetic head shown in FIGS. 27 and 28.

First of all, as shown in FIG. 29, on the substrate 5 are successively formed the insulating layer 501, the bottom shielding layer 28, the bottom shielding gap layer 230, the insulating layers 231, 232 and the like by means of normal technique.

Figure 30:
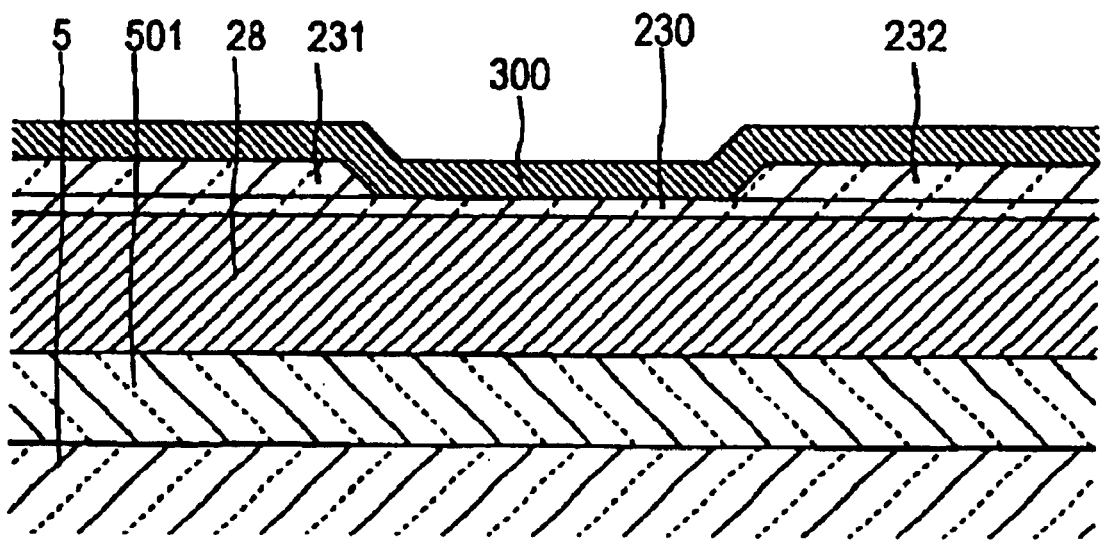
FIG. 30 is a cross sectional view showing a step after the step shown in FIG. 29.

Then, as shown in FIG. 30, a film 300 to be patterned to the GMR element 30 is formed on the bottom shielding gap layer 230 and the insulating layers 231, 232. In reality, the film 300 is made of a multilayered film though in FIG. 30, the film 300 is made of a single-layered film.

Figure 31:
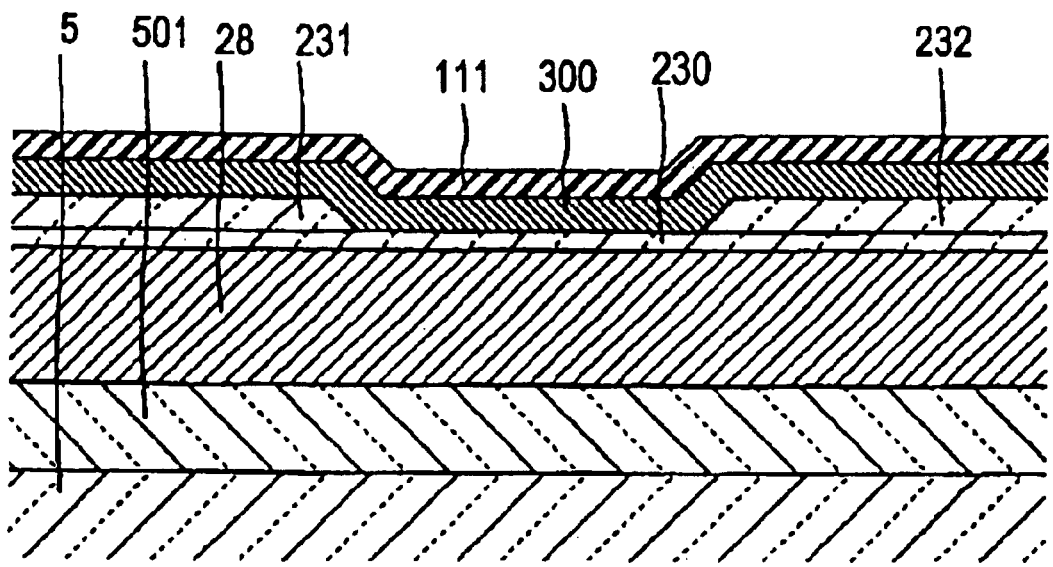
FIG. 31 is a cross sectional view showing a step after the step shown in FIG. 30.

Then, as shown in FIG. 31, a bottom resist layer 111 is formed on the film 300. The bottom resist layer 111 is made by PMGI or the like to satisfy the requirements as mentioned previously.

Figure 32:
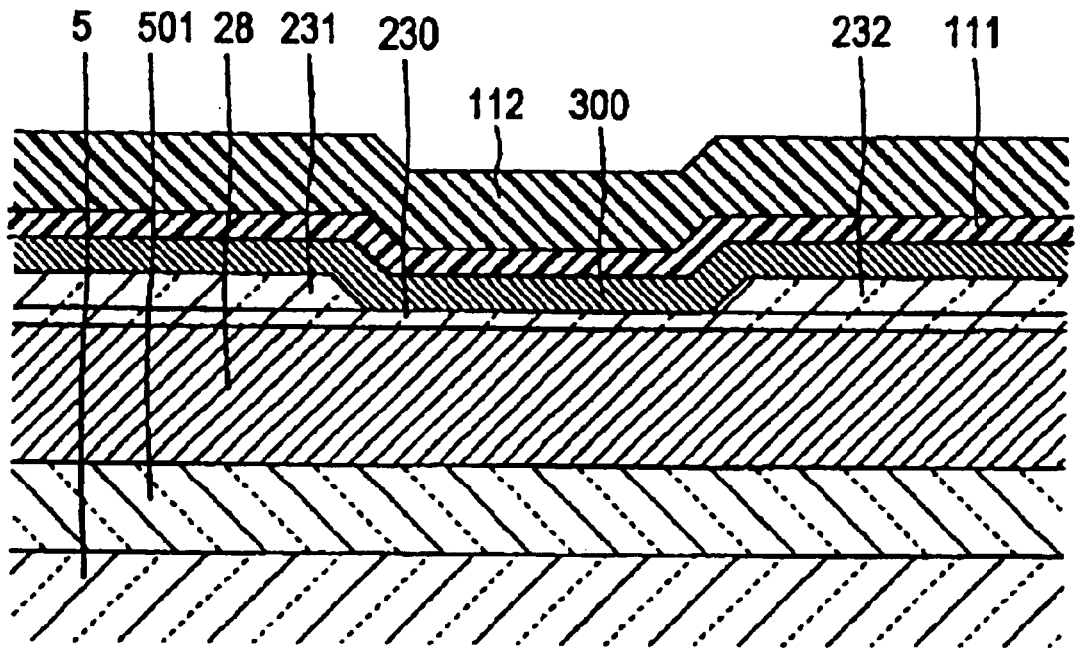
FIG. 32 is a cross sectional view showing a step after the step shown in FIG. 31.

Then, as shown in FIG. 32, a top resist layer 112 is formed on the bottom resist layer 111. The top resist layer 112 is made of a material as mentioned previously.

Figure 33:
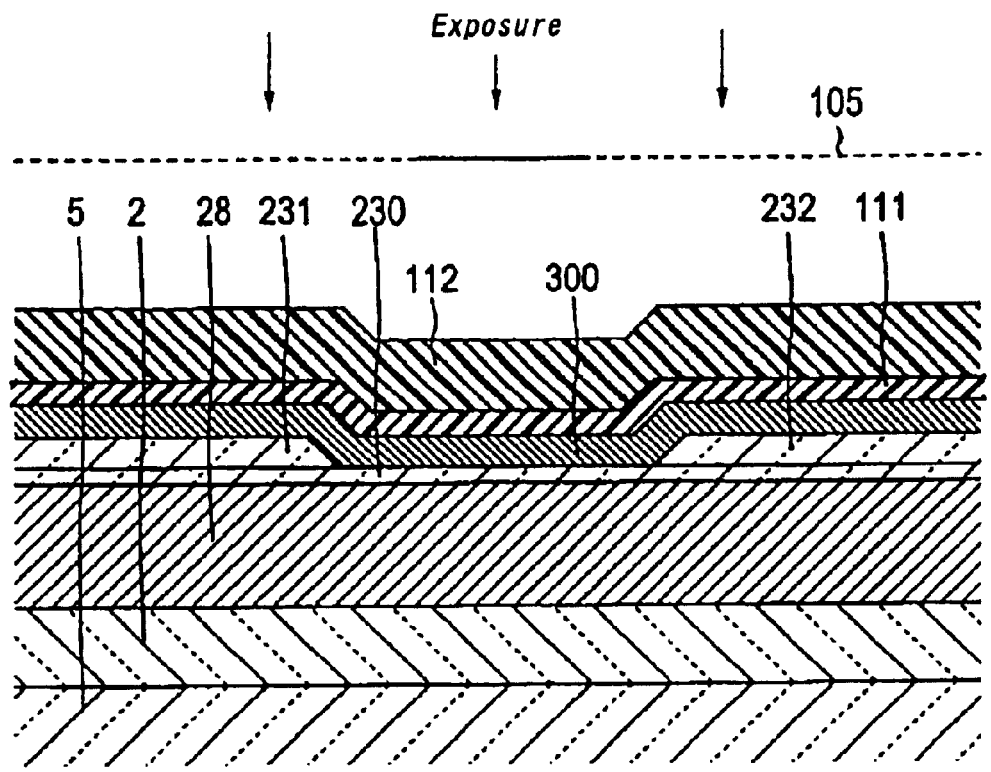
FIG. 33 is a cross sectional view showing a step after the step shown in FIG. 32.

Then, as shown in FIG. 33, the top resist layer 112 is exposed via a mask 105 to form a patterning latent image thereon. The mask 105 is disposed at the position of the GMR element 30.

Then, the top resist layer 112 is developed, and the bottom resist layer 111 is partially dissolved. After the development, the bottom resist layer 111 and the top resist layer 112 are washed with water and dried to form an intended resist mask 110.

Figure 34:
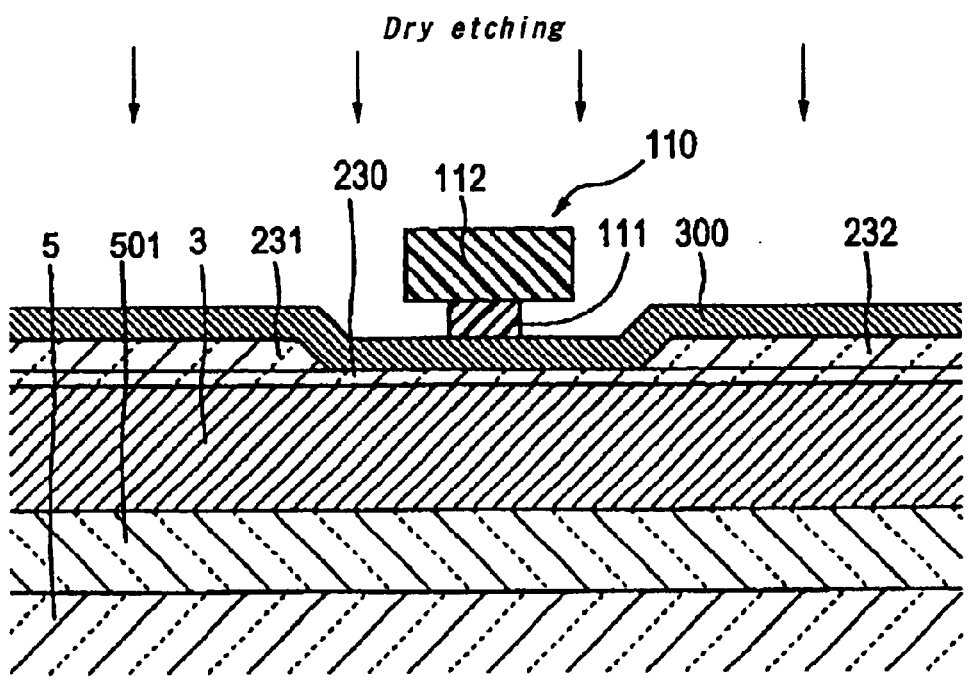
FIG. 34 is a cross sectional view showing a step after the step shown in FIG. 33.

In the resist mask 110, some undercuts are made at the bottom portion thereof due to the partial dissolution of the bottom resist layer 112, as shown in FIG. 34.

Figure 35:
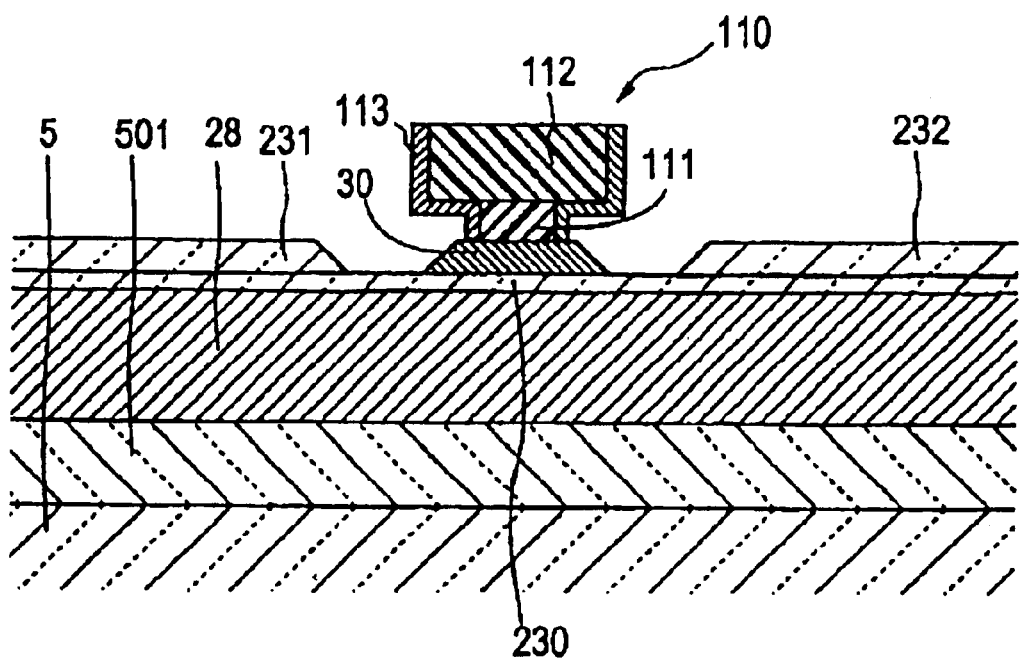
FIG. 35 is a cross sectional view showing a step after the step shown in FIG. 34.

Then, as shown in FIGS. 34 and 35, the film 300 is selectively etched by means of dry etching such as ion milling to form the GMR element 30. In the etching process, the dry etched debris 113 are attached over the resist mask 110, and contacted with the GMR element 30 located below the resist mask 110.

Figure 36:
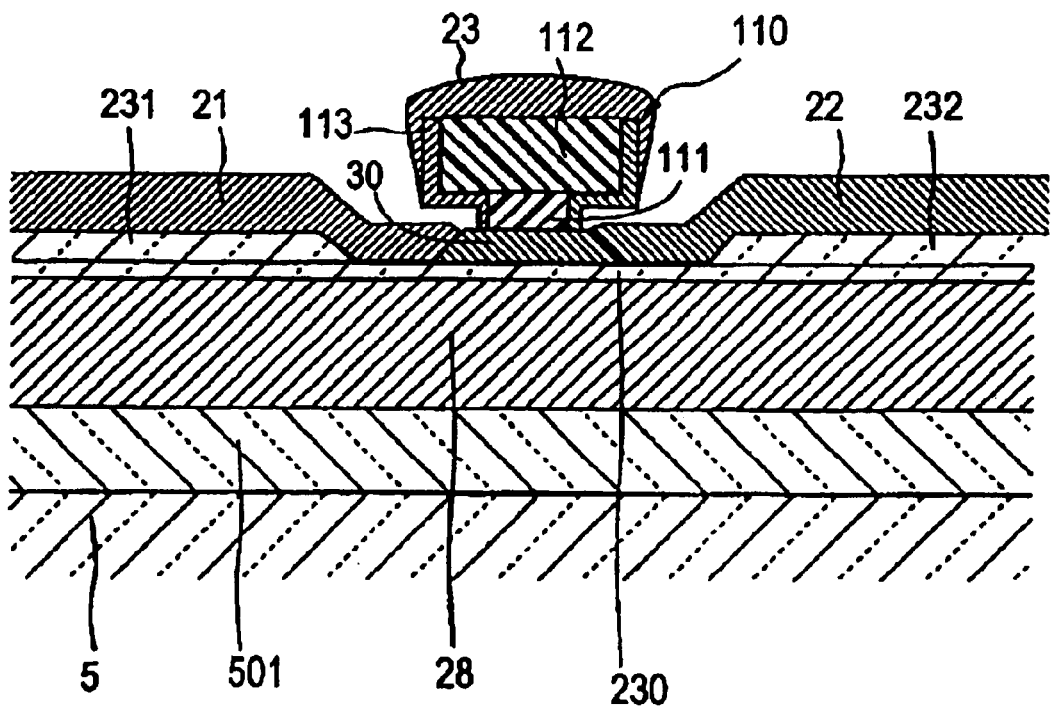
FIG. 36 is a cross sectional view showing a step after the step shown in FIG. 35.

Then, as shown in FIG. 36, the patterned electrode/magnetic domain controlling films 21 and 22 are formed by means of film-forming process of sputtering, CVD or the like while the resist mask 110 is kept remained. The patterned thin films 21 and 22 includes a pair of electrode layers and magnetic domain controlling films which are connected with the GMR element 30. The resultant debris 23 from the film-forming process is attached on the resist mask 110.

Conventionally, the resist mask 110 is peeled off from on the patterned thin film 30 by means of lift off after the step shown in FIG. 36. In this case, the dry etched debris 113 is also peeled off by force to create some flashes at the boundaries between the patterned thin film 30 and the resist mask 110.

Figure 37:
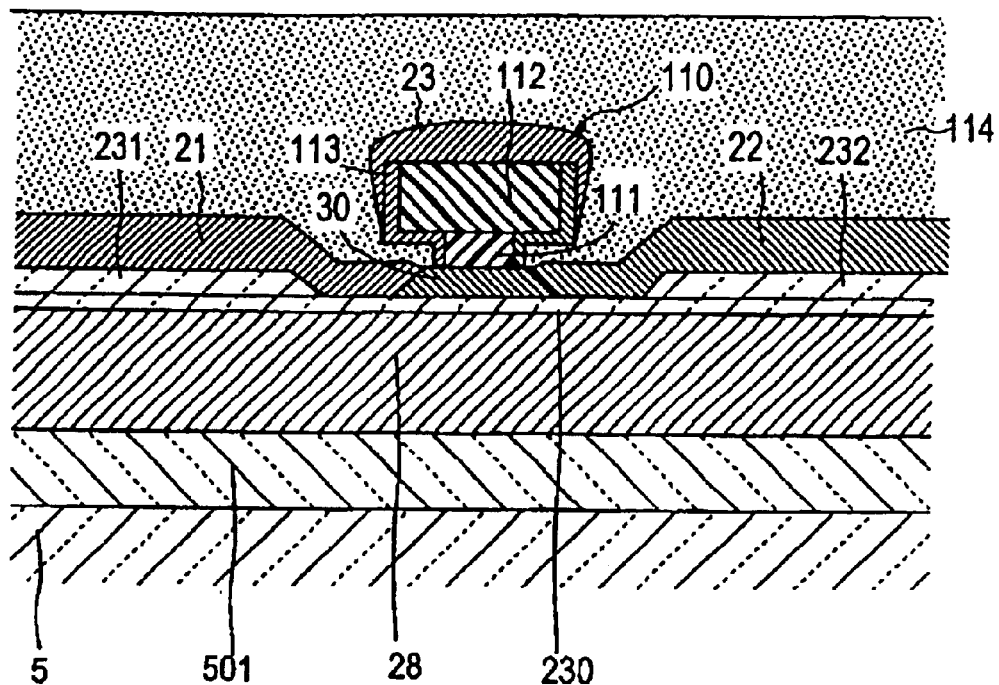
FIG. 37 is a cross sectional view showing a step after the step shown in FIG. 36.
Figure 38:
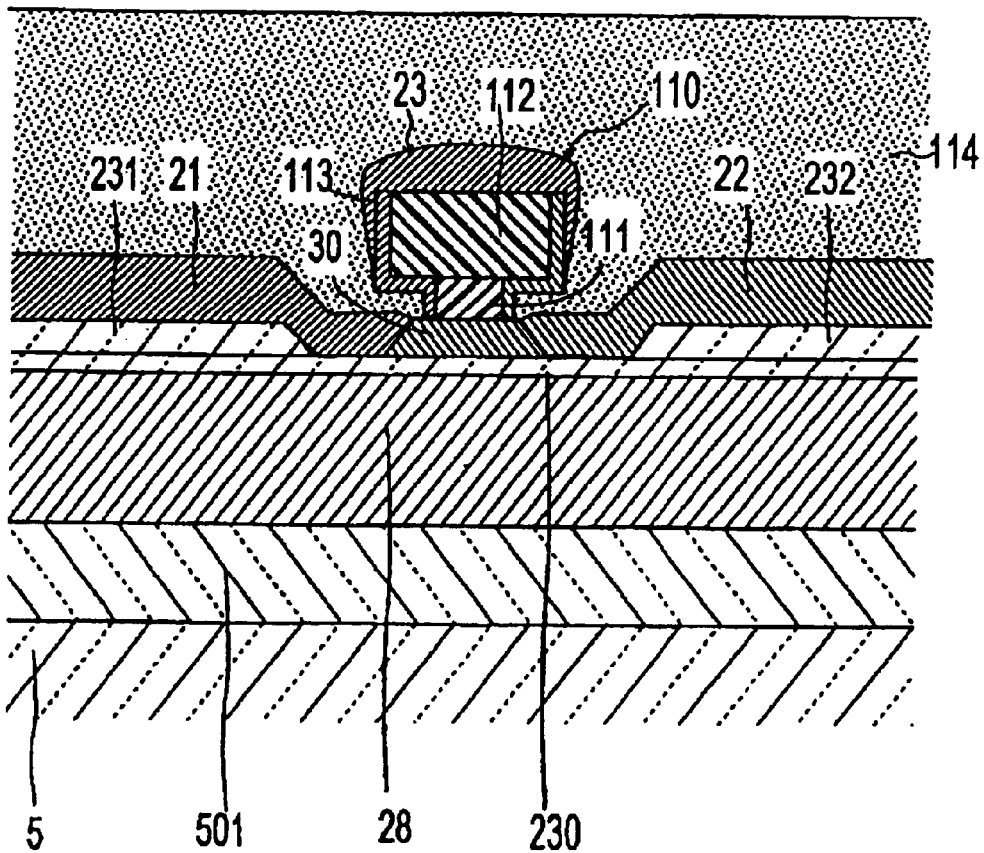
FIG. 38 is a cross sectional view showing a step after the step shown in FIG. 37.
Figure 39:
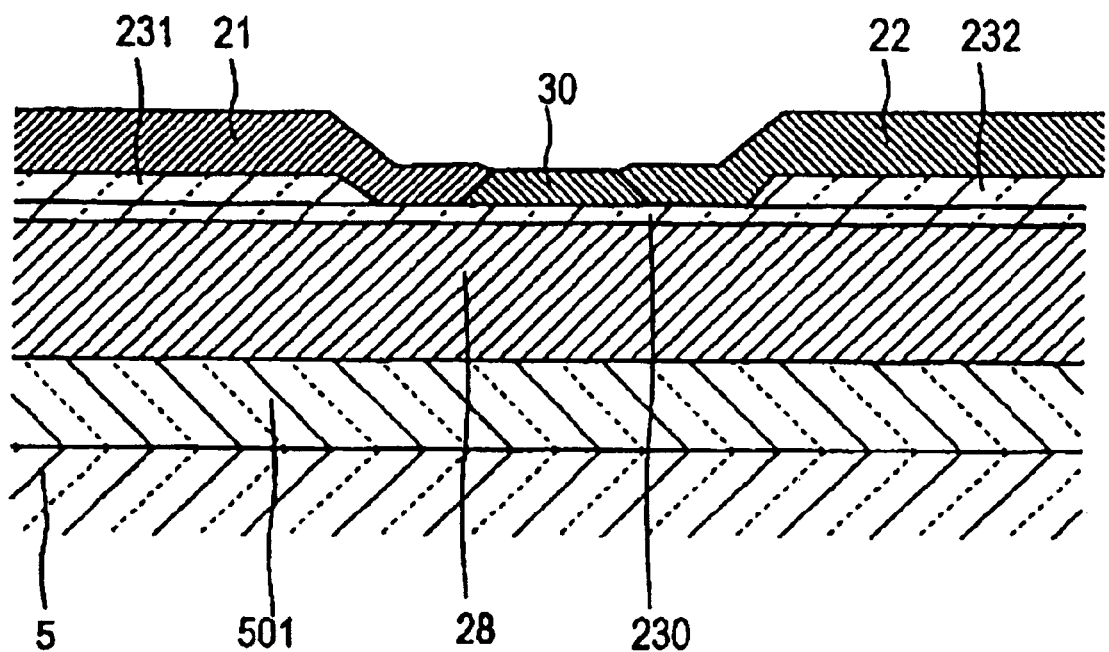
FIG. 39 is a cross sectional view showing a step after the step shown in FIG. 38.

In the present invention, in this point of view, as shown in FIG. 37, an organic resin layer 114 with an optical crosslinking agent therein is coated over the resist mask 110, the patterned electrode/magnetic domain controlling films 21, 22 and the GMR element 30. Then, the organic resin layer 114 is crosslinked. If the organic resin layer 114 is negative due to the crosslinking agent, exposure for crosslinking is carried out over the assembly under fabrication. In this case, the dry etched debris 113 are trapped by the crosslinked organic resin layer 114.

Then, the assembly is immersed into an organic solution and vibrated to dissolve the organic resin layer 114 and the resist mask 110 therein. Instead of the immersion and vibration, ultrasonic wave may be irradiated onto the assembly.

In this case, since the organic resin layer 114 and the resist mask 110 are removed through the trapping of the dry etched debris 113 not by force, the GMR element 30 and the patterned electrode/magnetic domain controlling films 21 and 22 can be formed without flashes.

Thereafter, the fabricating process of recording head will be performed by means of normal technique.

Concretely, the fabricating process will be performed in the same manner as mentioned in "3. Combination of lift off and dry etching". Not described and illustrated, the present invention can be applied to a thin film magnetic head with a CPP-GMR (Current Perpendicular to a Plane of a Giant Magnetoresistance) element or a TMR element if some steps are modified. In the thin film magnetic head with the CPP-GMR element, a current is flowed perpendicular to the element.

Although the present invention was described in detail with reference to the above examples, this invention is not limited to the above disclosure and every kind of variation and modification may be made without departing from the scope of the present invention. For example, this invention can be applied to another micro device such as a semiconductor device, a sensor with a thin film, an actuator with a thin film and the like except the thin film. magnetic head.

As mentioned above, according to the present invention can be provided a method for fabricating a patterned thin film, whereby the resist mask can be removed without flashes, and a micro device with the patterned thin film.

What is claimed is:

1. A method for fabricating a patterned thin film, comprising the steps of:

preparing a base, forming a resist mask on said base, forming a thin film via said resist mask to form a patterned thin film, coating an organic resin with an optical crosslinking agent therein to form an organic resin layer over said resist mask and said patterned thin film, crosslinking said organic resin layer, and removing said resist mask and said organic resin layer.

2. The fabricating method as defined in claim 1, wherein said resist mask is composed of a bottom resist layer with undercuts and a top resist layer, whereby the surface area of said top resist layer is set larger than the surface area of said bottom resist layer.

3. The fabricating method as defined in claim 2, wherein said bottom resist layer is made of polymethyiglutarimide (PMGI).

4. The fabricating method as defined in claim 3, wherein said top resist layer is made of a phenol-based hydroxyl group-containing resist.

5. The fabricating method as defined in claim 1, wherein said patterned thin film is formed by means of lift off, dry etching or the combination thereof.

6. The fabricating method as defined in claim 1, wherein said resist mask and said organic resin layer are removed through immersion in an organic solvent and vibration therein.

7. The fabricating method as defined in claim 1, wherein said resist mask and said organic resin layer are removed through irradiation of ultrasonic wave.

8. The fabricating method as defined in claim 1, wherein said patterned thin film includes no flash.

9. A micro device comprising a patterned thin film without flashes which is formed by a fabricating method as defined in claim 1.

10. A thin film magnetic head comprising a patterned thin film without flashes which is formed by a fabricating method as defined in claim 1.

11. The thin film magnetic head as defined in claim 10, comprising a magnetoresistive effective element which is composed of said patterned thin film.

* * * * *